United States Patent
Hung et al.

(10) Patent No.: US 10,446,745 B1
(45) Date of Patent: Oct. 15, 2019

(54) METHOD OF MANUFACTURING MAGNETORESISTIVE RANDOM ACCESS MEMORY CELL

(71) Applicant: UNITED MICROELECTRONICS CORP., Hsin-Chu (TW)

(72) Inventors: Ching-Wen Hung, Tainan (TW); Kun-Ju Li, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/004,446

(22) Filed: Jun. 11, 2018

(30) Foreign Application Priority Data

Jun. 7, 2018 (CN) .......................... 2018 1 0579866

(51) Int. Cl.
| H01L 43/12 | (2006.01) |
| G11C 11/16 | (2006.01) |
| H01L 27/22 | (2006.01) |
| H01L 43/02 | (2006.01) |
| H01L 43/10 | (2006.01) |
| H01L 27/12 | (2006.01) |

(52) U.S. Cl.
CPC ............ *H01L 43/12* (2013.01); *G11C 11/161* (2013.01); *H01L 27/1222* (2013.01); *H01L 43/02* (2013.01); *H01L 43/10* (2013.01)

(58) Field of Classification Search
CPC ...... G11C 11/161; H01L 27/222; H01L 43/02; H01L 43/10; H01L 43/12
See application file for complete search history.

(56) References Cited

U.S. PATENT DOCUMENTS

| 8,866,242 B2 | 10/2014 | Li | |
| 9,818,935 B2 | 11/2017 | Chuang | |
| 10,283,698 B2 * | 5/2019 | Ko | H01L 43/02 |
| 2008/0205126 A1 * | 8/2008 | Kajiyama | G11C 11/16 365/158 |
| 2009/0039451 A1 * | 2/2009 | Ueno | H01L 27/228 257/421 |
| 2009/0302404 A1 * | 12/2009 | Matsuda | H01L 43/08 |
| 2016/0268336 A1 * | 9/2016 | Shum | H01L 43/12 |
| 2016/0365505 A1 * | 12/2016 | Lu | H01L 27/222 |
| 2018/0198059 A1 * | 7/2018 | Ko | H01L 43/02 |

* cited by examiner

*Primary Examiner* — Allan R Wilson
(74) *Attorney, Agent, or Firm* — Winston Hsu

(57) ABSTRACT

A method of manufacturing a magnetoresistive random access memory cell includes the following steps. A first dielectric layer including a first metal line therein is formed on a substrate. A patterned second dielectric layer is formed over the first dielectric layer, wherein the patterned second dielectric layer includes a recess exposing the first metal line. A barrier layer conformally covers the recess and the patterned second dielectric layer. A metal fills up the recess and on the barrier layer. The metal is planarized until the barrier layer being exposed by serving the barrier layer as a stop layer. A magnetic tunneling junction and a top electrode over the metal are formed, thereby a magnetoresistive random access memory cell being formed.

12 Claims, 4 Drawing Sheets

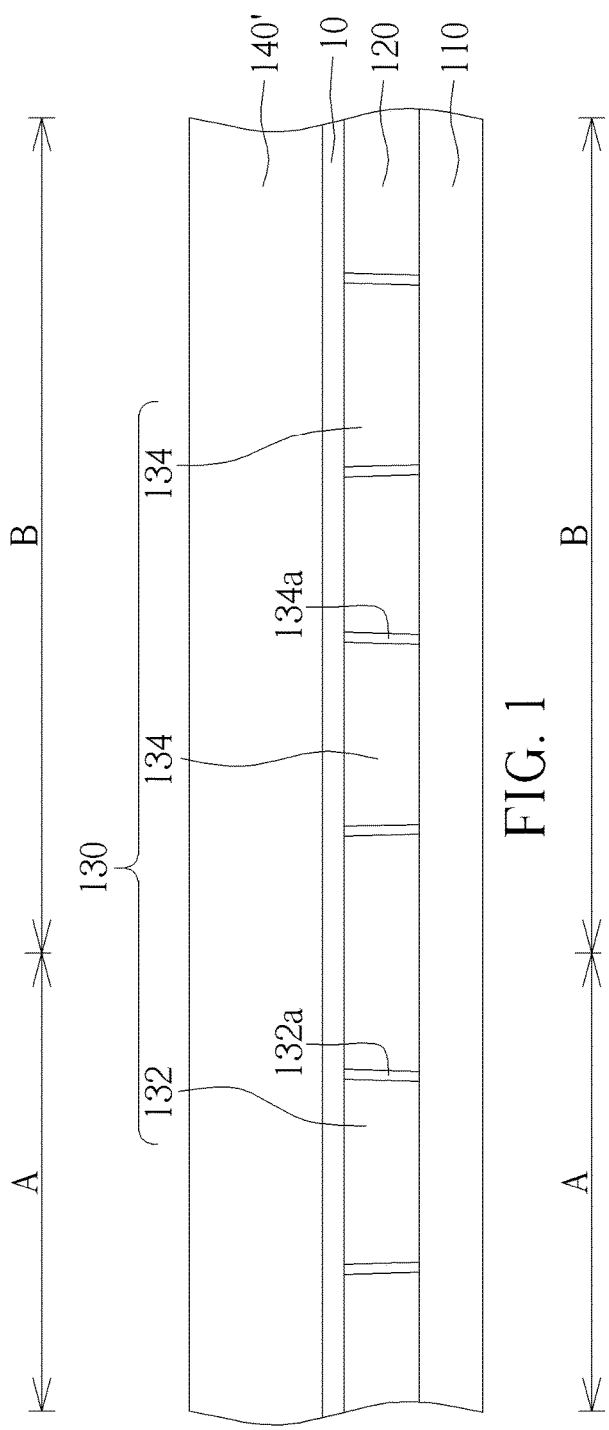
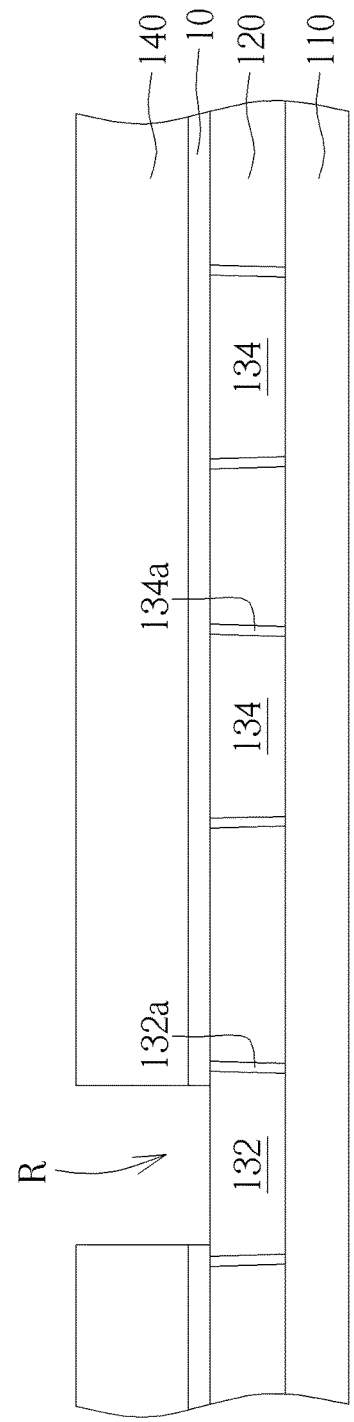
FIG. 1
FIG. 2

METHOD OF MANUFACTURING MAGNETORESISTIVE RANDOM ACCESS MEMORY CELL

BACKGROUND OF THE INVENTION

1. Field of the Invention

The present invention relates generally to a method of manufacturing a random access memory cell, and more specifically to a method of manufacturing a magnetoresistive random access memory cell.

2. Description of the Prior Art

Magnetoresistive random access memory (MRAM) is a type of memory device containing an array of MRAM cells that store data using resistance values instead of electronic charges. Each MRAM cell includes a magnetic tunnel junction (MTJ) unit whose resistance can be adjusted to represent a logic state "0" or "1."

Conventionally, the magnetic tunnel junction (MTJ) unit is comprised of a fixed magnetic layer, a free magnetic layer, and a tunnel layer disposed there between. The resistance of the magnetic tunnel junction (MTJ) unit can be adjusted by changing a direction of a magnetic moment of the free magnetic layer with respect to that of the fixed magnetic layer. When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The magnetic tunnel junction (MTJ) unit is coupled between top and bottom electrodes, and an electric current flowing through the magnetic tunnel junction (MTJ) from one electrode to another can be detected to determine the resistance, and therefore the logic state of the magnetic tunnel junction (MTJ).

SUMMARY OF THE INVENTION

The present invention provides a method of manufacturing a magnetoresistive random access memory cell, which serves a barrier layer as a stop layer, to prevent divots from forming in a dielectric layer below the barrier layer caused by planarizing or etching.

The present invention provides a method of manufacturing a magnetoresistive random access memory cell including the following steps. A first dielectric layer including a first metal line therein is formed on a substrate. A patterned second dielectric layer is formed over the first dielectric layer, wherein the patterned second dielectric layer includes a recess exposing the first metal line. A barrier layer conformally covers the recess and the patterned second dielectric layer. A metal fills up the recess and covers the barrier layer. The metal is planarized until the barrier layer being exposed by serving the barrier layer as a stop layer. A magnetic tunneling junction and a top electrode over the metal are formed, thereby a magnetoresistive random access memory cell being formed.

According to the above, the present invention provides a method of manufacturing a magnetoresistive random access memory cell, which forms a patterned second dielectric layer covering a first dielectric layer, wherein the patterned second dielectric layer includes a recess exposing a first metal line of the first dielectric layer; forms a barrier layer conformally covering the recess and the patterned second dielectric layer; a metal fills up the recess and covers the barrier layer. Thereafter, the metal is planarized until the barrier layer being exposed by serving the barrier layer as a stop layer. A magnetic tunneling junction and a top electrode over the metal are formed, thereby a magnetoresistive random access memory cell being formed. Since the metal is planarized until the barrier layer being exposed by serving the barrier layer as a stop layer, defects at the surface of the patterned second dielectric layer below the barrier layer can be avoided. Therefore, metals such as copper filling into defects at the surface of the patterned second dielectric layer or defects in a dielectric layer above the patterned second dielectric layer, that leads to short circuit, can be avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 schematically depicts a cross-sectional view of a method of manufacturing a magnetoresistive random access memory cell according to an embodiment of the present invention.

FIG. 2 schematically depicts a cross-sectional view of a method of manufacturing a magnetoresistive random access memory cell according to an embodiment of the present invention.

DETAILED DESCRIPTION

Figure 3:
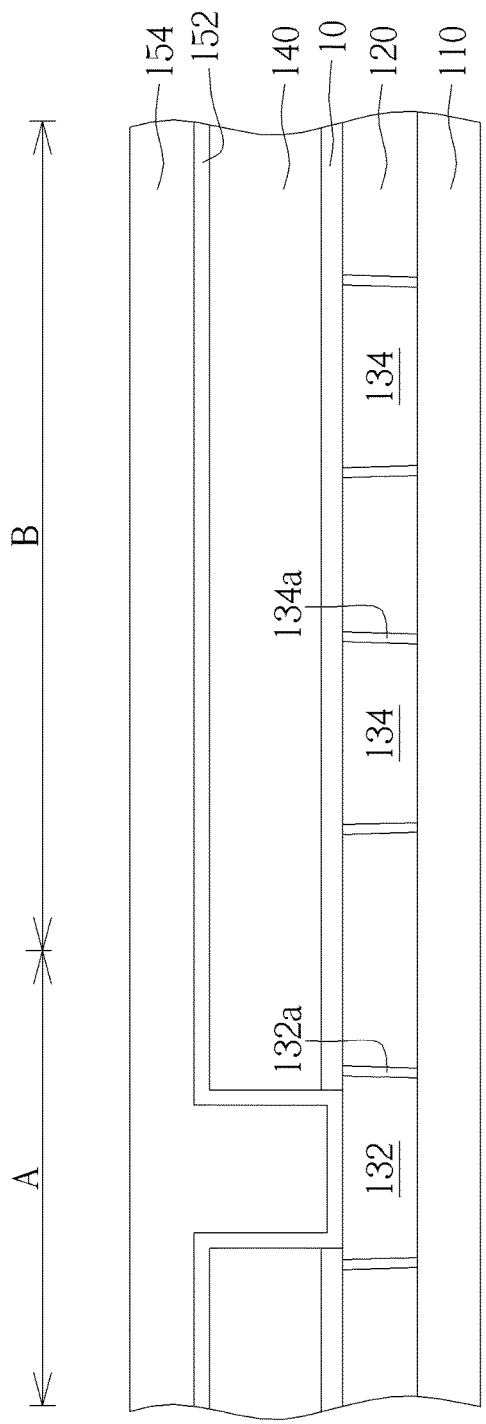
FIG. 3 schematically depicts a cross-sectional view of a method of manufacturing a magnetoresistive random access memory cell according to an embodiment of the present invention.

FIGS. 1-7 schematically depict cross-sectional views of a method of manufacturing a magnetoresistive random access memory cell according to an embodiment of the present invention. As shown in FIG. 1, a substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In this embodiment, the substrate 110 may include an interlayer dielectric layer located on a semiconductor substrate such as a silicon substrate, and components such as transistors located in the interlayer dielectric layer and on the silicon substrate, but it is not limited thereto. The substrate 110 may further include an inter-metal dielectric layer or etc. In this embodiment, the substrate 110 may include a magnetoresistive random access memory area A and a logic area B. A magnetoresistive random access memory cell of the present invention is in the magnetoresistive random access memory area A.

A first dielectric layer 120 is formed on the substrate 110, wherein the first dielectric layer 120 may be an oxide layer, which may be an inter-metal dielectric layer, but it is not limited thereto. The first dielectric layer 120 may include a first metal interconncect structure 130 therein. The first metal interconncect structure 130 may include a first metal line 132 in the magnetoresistive random access memory area A, and a second metal line 134 in the logic area B. A barrier layer 132a and a barrier layer 134a may surround the first metal line 132 and the second metal line 134 respectively. The barrier layer 132a/134a may be a tantalum nitride layer, and the first metal line 132 and the second metal line 134 may be copper, but the present invention is not restricted thereto.

A cap layer 10 is selectively formed on the first dielectric layer 120. The cap layer 10 may be a carbon containing silicon nitride layer, but it is not limited thereto. Please refer to FIGS. 1-2, a patterned second dielectric layer 140 is formed to cover the first dielectric layer 120. The patterned second dielectric layer 140 may include a recess R exposing the first metal line 132. The patterned second dielectric layer 140 may be an oxide layer. The step of forming the patterned second dielectric layer 140 to cover the first dielectric layer 120 may include the following. A second dielectric layer 140' is formed to blanketly cover the first dielectric layer 120, as shown in FIG. 1. Then, the second dielectric layer 140' and the cap layer 10 are patterned to expose the first metal line 132, and to form the patterned second dielectric layer 140, as shown in FIG. 2.

As shown in FIG. 3, a barrier layer 152 is formed to conformally cover the recess R and the patterned second dielectric layer 140. A metal 154 fills up the recess R and covers the barrier layer 152. The barrier layer 152 may be a titanium layer, a titanium nitride layer or a titanium/titanium nitride layer, and the metal 154 may include tungsten, but it is not limited thereto.

Figure 4:
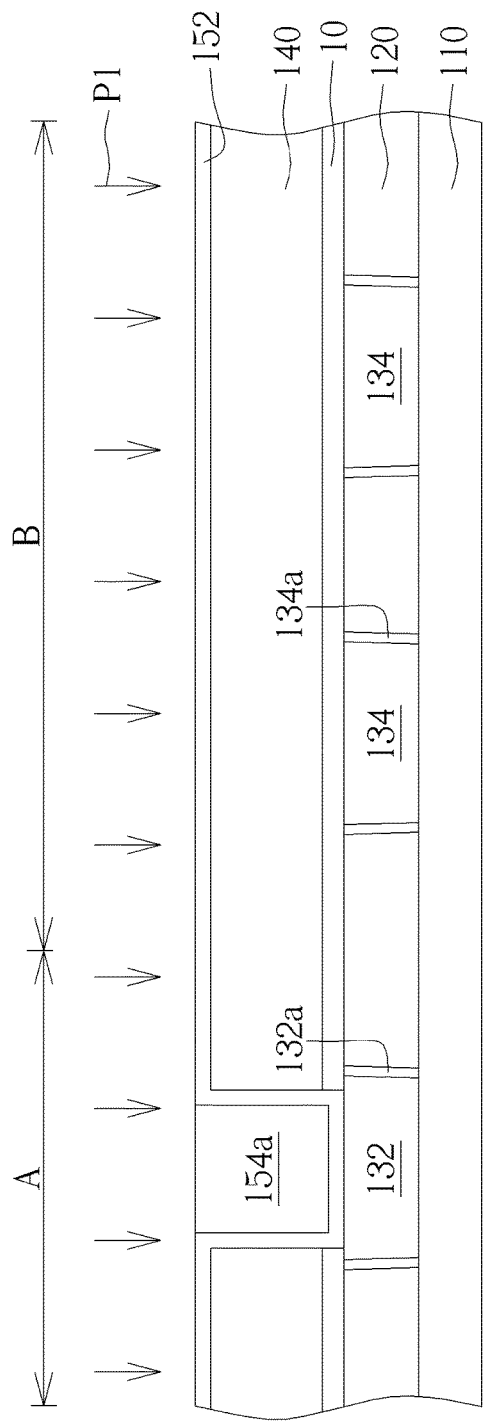
FIG. 4 schematically depicts a cross-sectional view of a method of manufacturing a magnetoresistive random access memory cell according to an embodiment of the present invention.
Figures 7, 8:
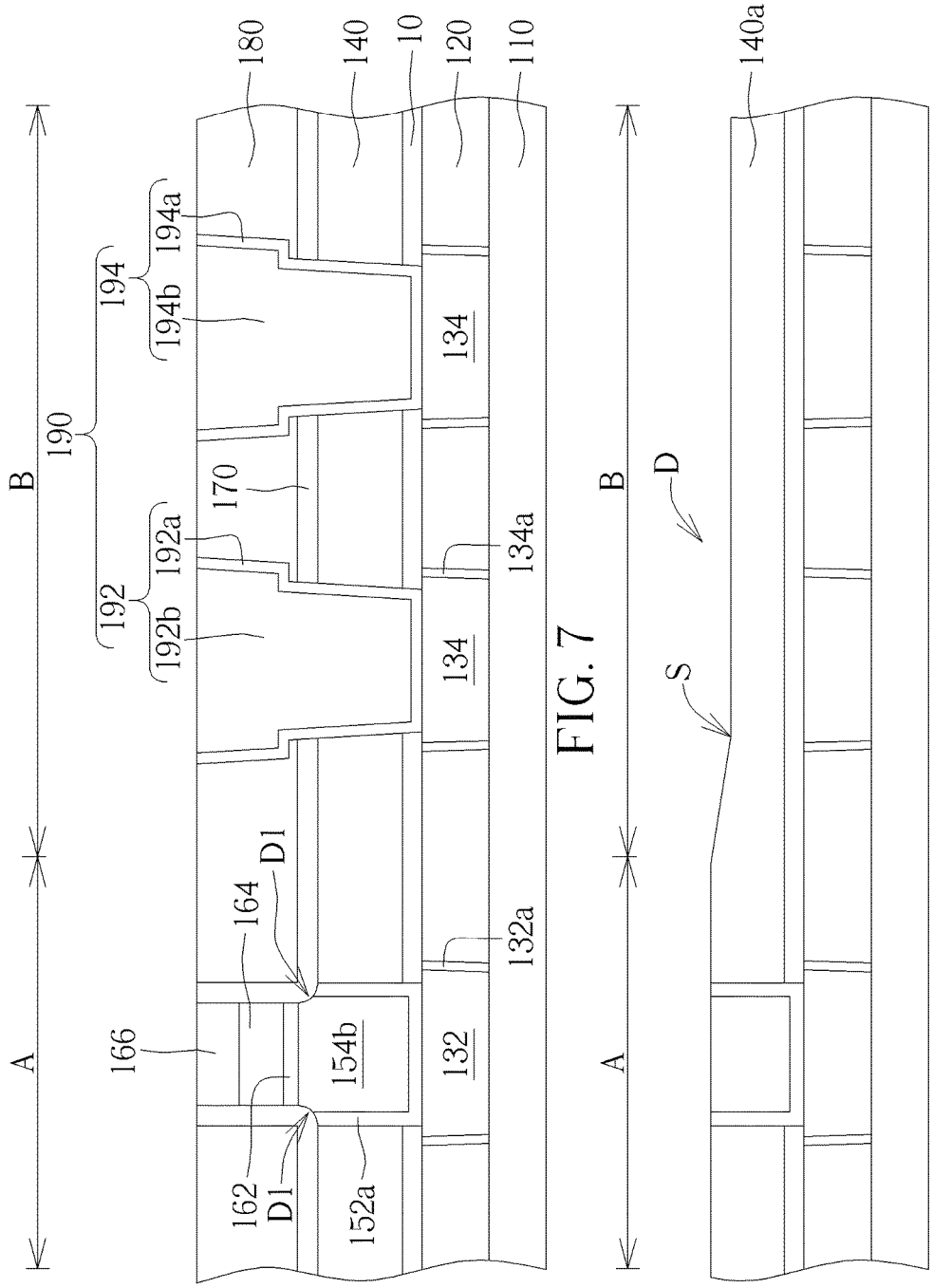
FIG. 7 schematically depicts a cross-sectional view of a method of manufacturing a magnetoresistive random access memory cell according to an embodiment of the present invention.
FIG. 8 schematically depicts a cross-sectional view of a method of manufacturing a magnetoresistive random access memory cell according to another embodiment of the present invention.

The metal 154 is planarized until exposing the barrier layer 152 by serving the barrier layer 152 as a stop layer, thereby a metal 154a being formed, as shown in FIG. 4. In this embodiment, the metal 154 is planarized by a planarization process P1, and the planarization process has a high selectivity to the metal 154 and the barrier layer 152. That is, the removing rate of the planarization process P1 to the metal 154 is much larger than the removing rate of the planarization process P1 to the barrier layer 152, thereby the metal 154 on the barrier layer 152 can being removed completely, while the barrier layer 152 is preserved. For instance, the removing rate of the planarization process P1 to the metal 154 is 45 time of the removing rate of the planarization process P1 to the barrier layer 152, depending upon practical requirements. By serving the barrier layer 152 as a stop layer, defects such as divots D at a non-flatness surface of a patterned second dielectric layer 140a caused by etching the dielectric layer 140a directly can be avoided, as shown in FIG. 8. Therefore, metals such as copper filling into defects at the surface of the patterned second dielectric layer 140 or defects in a dielectric layer above the patterned second dielectric layer 140, leading to short circuit, can be avoided.

Figure 5:
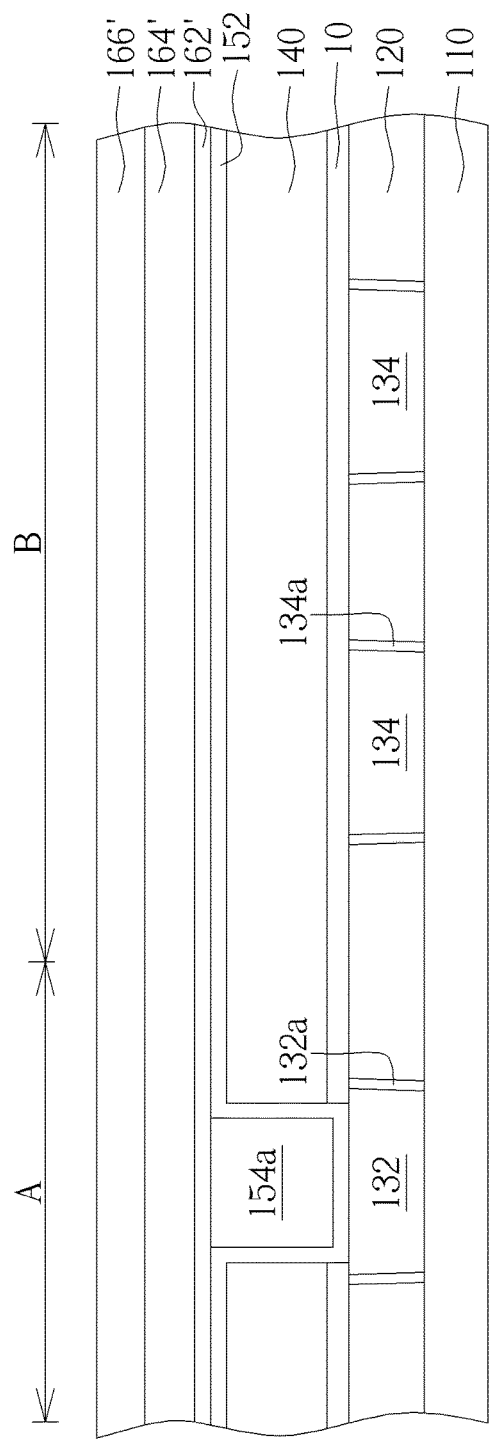
FIG. 5 schematically depicts a cross-sectional view of a method of manufacturing a magnetoresistive random access memory cell according to an embodiment of the present invention.
Figure 6:
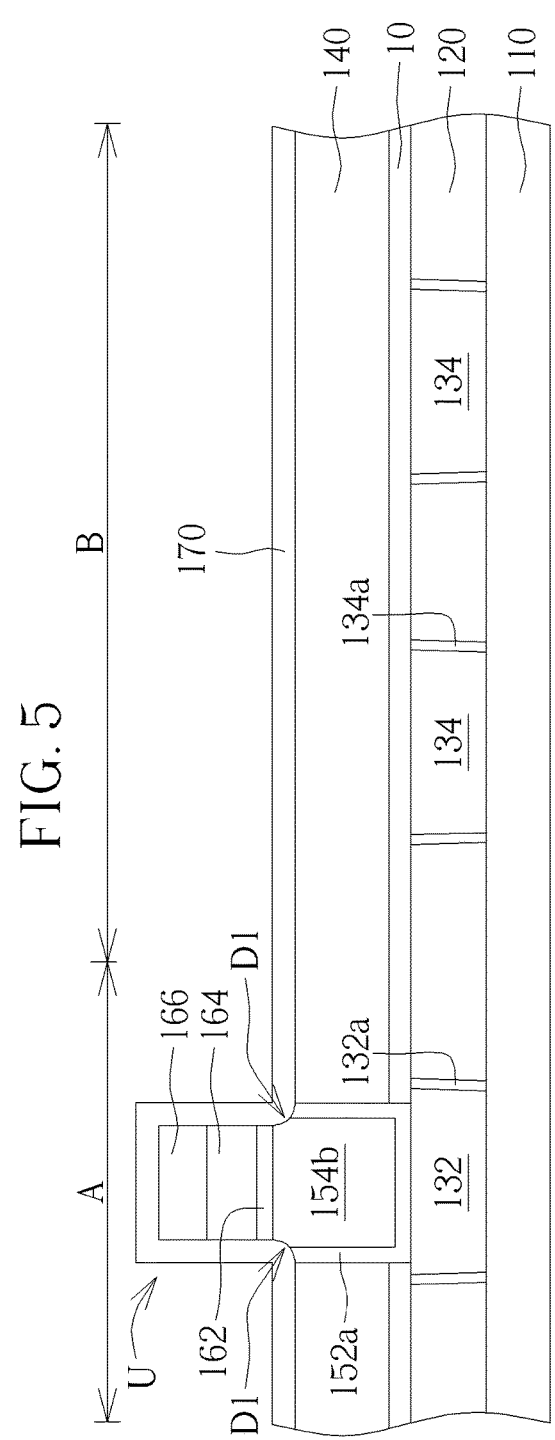
FIG. 6 schematically depicts a cross-sectional view of a method of manufacturing a magnetoresistive random access memory cell according to an embodiment of the present invention.

Please refer to FIGS. 5-6, a seeding layer 162, a magnetic tunneling junction 164 and a top electrode 166 are selectively formed to cover a metal 154b. The step of forming the seeding layer 162, the magnetic tunneling junction 164 and the top electrode 166 to cover the metal 154b may include the following. A seeding layer 162', a magnetic tunneling junction layer 164' and a top electrode layer 166' may be blanketly deposited to cover the metal 154a and the barrier layer 152, and then the top electrode layer 166', the magnetic tunneling junction layer 164' and the seeding layer 162' are patterned to form the seeding layer 162, the magnetic tunneling junction 164 and the top electrode 166, thereby a magnetoresistive random access memory cell U being formed. The seeding layer 162 may be a tantalum nitride layer, and the magnetic tunneling junction 164 may include multilayers, which may be composed by an insulating layer sandwiched by two ferromagnetic material layers, called magnetic tunnel junction (MTJ). The resistance of the magnetic tunnel junction (MTJ) unit can be adjusted by changing a direction of a magnetic moment of the free magnetic layer (one of the ferromagnetic material layer) with respect to that of the fixed magnetic layer (the other of the ferromagnetic material layer). When the magnetic moment of the free magnetic layer is parallel to that of the fixed magnetic layer, the resistance of the magnetic tunnel junction (MTJ) unit is low, whereas when the magnetic moment of the free magnetic layer is anti-parallel to that of the fixed magnetic layer, the resistance of the magnetic tunnel junction (MTJ) unit is high. The top electrode 166 may be metal such as tungsten.

It is emphasized that, the barrier layer 152 exposed by the seeding layer 162, the magnetic tunneling junction 164 and the top electrode 166 are removed while the seeding layer 162', the magnetic tunneling junction layer 164' and the top electrode layer 166' are patterned, thereby a barrier layer 152a surrounding the metal 154b being formed. Otherwise, an etching back process may be performed after the step of planarizing the metal 154 until exposing the barrier layer 152 by serving the barrier layer 152 as a stop layer as shown in FIG. 4, to remove the barrier layer 152 (exceeding from the recess R of FIG. 2) beside the metal 154a and on the patterned second dielectric layer 140. Furthermore, the metal 154a exposed by the seeding layer 162, the magnetic tunneling junction 164 and the top electrode 166 is removed while the seeding layer 162', the magnetic tunneling junction layer 164' and the top electrode layer 166' are patterned, thereby the metal 154b being formed, which has divots D1 at the top. The metal 154b and the barrier layer 152a preferably connect the seeding layer 162/the magnetic tunneling junction 164 and the patterned second dielectric layer 140 smoothly.

As shown in FIG. 6, a cap layer 170 is formed to conformally cover the seeding layer 162, the magnetic tunneling junction 164, the top electrode 166 and the patterned second dielectric layer 140. The cap layer 170 may be a nitride layer, but it is not limited thereto.

As shown in FIG. 7, a third dielectric layer 180 is formed to cover the patterned second dielectric layer 140 but exposing the top electrode 166, and a second metal interconnect structure 190 is formed in the third dielectric layer 180 and the patterned second dielectric layer 140. More precisely, a third dielectric layer (not shown) may be deposited blanketly and then the third dielectric layer (not shown) and the cap layer 170 are planarized to expose the top electrode 166, and form the third dielectric layer 180. A second metal interconnect structure 190 may be formed in the third dielectric layer 180 and the patterned second dielectric layer 140 by a dual damascene process, but it is not limited thereto. The second metal interconnect structure 190 directly contacts the second metal line 134. The second metal interconnect structure 190 may include two plugs 192 and 194, and each of the plugs 192 and 194 may include a barrier layer 192a/194a surrounding the metal 192b/194b. The barrier layer 192a/194a may be a tantalum nitride layer, and the metal 192b/194b may be copper, but it is not limited thereto.

To summarize, the present invention provides a method of manufacturing a magnetoresistive random access memory cell, which forms a patterned second dielectric layer covering a first dielectric layer, wherein the patterned second dielectric layer includes a recess exposing a first metal line of the first dielectric layer; forms a barrier layer conformally covering the recess and the patterned second dielectric layer; a metal fills up the recess and covers the barrier layer. Thereafter, the metal is planarized until the barrier layer being exposed by serving the barrier layer as a stop layer. A magnetic tunneling junction and a top electrode over the metal are formed, thereby a magnetoresistive random access memory cell being formed. Since the metal is planarized until the barrier layer being exposed by serving the barrier layer as a stop layer, defects at the surface of the patterned second dielectric layer below the barrier layer can be avoided. Therefore, metals such as copper filling into defects at the surface of the patterned second dielectric layer or defects in a dielectric layer above the patterned second dielectric layer, that leads to short circuit, can be avoided.

Moreover, the barrier layer and the metal exposed by the magnetic tunneling junction and the top electrode are removed while the magnetic tunneling junction layer and the top electrode layer are patterned to form the magnetic tunneling junction and the top electrode. Therefore, the metal and the barrier layer can connect the magnetic tunneling junction and the patterned second dielectric layer smoothly. An etching back process may be performed after the metal is planarized until exposing the barrier layer by serving the barrier layer as a stop layer, to remove the barrier layer beside the metal and on the patterned second dielectric layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a magnetoresistive random access memory cell, comprising:
    forming a first dielectric layer on a substrate, wherein the first dielectric layer comprises a first metal line;
    forming a patterned second dielectric layer covering the first dielectric layer, wherein the patterned second dielectric layer comprises a recess exposing the first metal line;
    forming a barrier layer conformally covering the recess and the patterned second dielectric layer;
    a metal filling the recess and covering the barrier layer;
    planarizing the metal until the barrier layer being exposed, using the barrier layer as a stop layer; and
    forming a magnetic tunneling junction and a top electrode covering and right above the metal, thereby a magnetoresistive random access memory cell being formed, wherein the step of forming the magnetic tunneling junction and the top electrode covering the metal comprises:
        blanketly depositing a magnetic tunneling junction layer and a top electrode layer covering the metal and the barrier layer: and
        patterning the magnetic tunneling junction layer and the top electrode layer to form the magnetic tunneling junction and the top electrode, wherein the barrier layer exposed by the magnetic tunneling junction and the top electrode when the magnetic tunneling junction layer and the top electrode layer are partly removed while being patterned.

2. The method of manufacturing a magnetoresistive random access memory cell according to claim 1, wherein the step of forming the patterned second dielectric layer covering the first dielectric layer comprises:
    forming a second dielectric layer covering the first dielectric layer; and
    patterning the second dielectric layer to expose the first metal line and form the patterned second dielectric layer.

3. The method of manufacturing a magnetoresistive random access memory cell according to claim 1, wherein the barrier layer comprises a titanium layer, a titanium nitride layer or a titanium/titanium nitride layer.

4. The method of manufacturing a magnetoresistive random access memory cell according to claim 1, wherein the metal comprises tungsten.

5. The method of manufacturing a magnetoresistive random access memory cell according to claim 1, wherein the metal exposed by the magnetic tunneling junction and the top electrode are removed while the magnetic tunneling junction layer and the top electrode layer are patterned.

6. The method of manufacturing a magnetoresistive random access memory cell according to claim 1, wherein the barrier layer exceeding from the recess is removed after the metal is planarized.

7. The method of manufacturing a magnetoresistive random access memory cell according to claim 1, further comprising:
    forming a cap layer conformally covering the magnetic tunneling junction and the top electrode.

8. The method of manufacturing a magnetoresistive random access memory cell according to claim 1, further comprising:
    forming a third dielectric layer covering the patterned second dielectric layer but exposing the top electrode.

9. The method of manufacturing a magnetoresistive random access memory cell according to claim 8, wherein the substrate comprises a magnetoresistive random access memory area and a logic area, wherein the magnetoresistive random access memory area comprises the magnetoresistive random access memory cell.

10. The method of manufacturing a magnetoresistive random access memory cell according to claim 9, wherein the first dielectric layer comprises a first metal interconnect structure therein, wherein the first metal interconnect structure comprises the first metal line in the magnetoresistive random access memory area, and a second metal line in the logic area.

11. The method of manufacturing a magnetoresistive random access memory cell according to claim 10, further comprising:
    forming a second metal interconnect structure in the third dielectric layer and the patterned second dielectric layer, wherein the second metal interconnect structure contacts the second metal line.

12. The method of manufacturing a magnetoresistive random access memory cell according to claim 5, wherein the metal is planarized by a planarization process, and the planarization process has a high selectivity to the metal and the barrier layer.

* * * * *